United States Patent [19]

Richard

[11] Patent Number: 4,995,539
[45] Date of Patent: Feb. 26, 1991

[54] METHOD AND APPARATUS FOR CLEAVING WAFERS

[76] Inventor: Heinz Richard, Schutzenmattstrasse 29, CH-8802 Kilchberg, Switzerland

[21] Appl. No.: 406,943

[22] Filed: Sep. 13, 1989

[30] Foreign Application Priority Data

Oct. 10, 1988 [EP] European Pat. Off. ........ 88810694.5

[51] Int. Cl.⁵ ........................... B26F 3/00; B28D 5/00
[52] U.S. Cl. ................................. 225/2; 225/96.05; 225/103; 225/105
[58] Field of Search ............... 225/2, 96, 96.5, 103, 225/105

[56] References Cited

U.S. PATENT DOCUMENTS

| | | | |
|---|---|---|---|
| 3,396,452 | 8/1968 | Sato et al. | 29/413 |
| 3,537,169 | 11/1970 | Eigeman et al. | 225/2 |
| 3,562,057 | 2/1971 | McAlister et al. | 225/2 |
| 3,567,791 | 4/1972 | Hobbs | 225/96.5 |
| 3,667,661 | 6/1972 | Farmer | 225/2 |
| 3,677,875 | 7/1972 | Althouse | 225/2 |
| 3,790,051 | 2/1974 | Moore | 225/1 |
| 3,920,168 | 11/1975 | Regan et al. | 225/96.5 |

FOREIGN PATENT DOCUMENTS 1427772 11/1965 Fed. Rep. of Germany.

OTHER PUBLICATIONS

IBM TDB, vol. 23, No. 10, Mar. 1981, pp. 4749, 4750.

Primary Examiner—Hien H. Phan
Attorney, Agent, or Firm—Donald M. Boles

[57] ABSTRACT

A method and apparatus for breaking a scribed workpiece such as a semiconductor wafer is taught. Briefly stated, the semiconductor wafer is disposed between two elastomeric foils, one of which is adhesively attached to the side of the workpiece which is not scribed. The foils are stretched and a force is then applied to the sandwich so that the workpiece breaks along the scribed lines. Due to the elastomeric nature of the foils the broken pieces separate slightly and remain separated after breaking, thereby preventing damage to adjacent surfaces of the workpiece.

19 Claims, 2 Drawing Sheets

METHOD AND APPARATUS FOR CLEAVING WAFERS

FIELD OF THE INVENTION

The present invention relates, generally, to a method and apparatus for breaking a plate-like workpiece such as a semiconductor wafer and more particularly to a method and device for breaking a plate-like workpiece sandwiched between two flexible foils.

BACKGROUND OF THE INVENTION

Cleaving GaAs and similar materials is a method which has been disclosed in IBM Technical Disclosure Bulletin, Vol. 23, No. 10, (March 1981), pp. 4749–4750. It involves scribing a wafer surface and then controllably bending the wafer so that it fractures along the scribed lines. Among the operative conditions disclosed as necessary, the following are of relevance:

To cleave a bar of given length L, the wafer should be thinner than L/2.

The scribed wafer should be bent in such manner that the plane of the bending radius is normal to the scribed lines on the convex side of the wafer.

The wafer must be mounted on a substrate which is sufficiently rigid so as to support the wafer, yet it must also be deformable to the necessary bending radius and should also be located on the concave side of the wafer when bent.

The convex side of the wafer must be constrained in order to prevent stress from being applied to the side of the wafer adjoining the substrate so as to prevent the wafer from separating from the substrate. A flexible material can be used to cover the wafer and the substrate.

A sandwich of the substrate, wafer and flexible upper foil must be joined by flexible adhesives which are readily removable and which will damage the cleaved pieces.

Non-rigid adhesive sheets are known in the art of processing semiconductor wafers. They are designed for use in holding semiconductor wafers firmly in place, e.g., while breaking processes are performed thereon. They are generally used in a sandwich comprised of a non-rigid PVC-foil and a polyester foil joined together by means of an acrylic adhesive. Such adhesives are available, for instance, from Nitto Electric Industrial Co., Ltd. (Japan). The adhesion of such foils to each other in the sandwich is about 100 to 350 N/m, depending of the type of sheet and the duration of its storage.

A device suitable for breaking a plate-like workpiece sandwiched between two flexible foils of a sheet of the above indicated kind is known in the art and available for instance from Dynatex Corporation (U.S.A.). This known device is comprised of a movable cross-table having a wafer affixable thereon and utilizes a wedge and an anvil therefor. The cross-table has an aperture adapted to be overlaid by the properly oriented wafer. The wedge is made to press the wafer against the anvil through the aperture. The anvil being made of hard rubber so as to be slightly resilient.

Using such know apparatus, the process of breaking a wafer comprises the steps of: scribing one of the workpiece surfaces with at least one scribing line in order to define a plane where the workpiece is to be broken; placing the workpiece, with its scribed surface facing upwards between an upper and lower foil, both foils being flexible and extending beyond the margins of the workpiece, an adhesive serving to join the workpiece to the lower foil; applying an upward force to the lower side of the sandwich structure in order to bend the workpiece, the plane of the radius being normal to the scribed lines on the convex side of the workpiece, so that the workpiece breaks into individual bars as determined by the scribed lines; and removing the upper foil whereafter the lower foil can be stretched so that the individual bars become separated and can be taken from the lower foil for further processing. However, known devices and methods of breaking a wafer are not specifically designed and adapted for the manufacture of semiconductor lasers whose mirror facets are obtained as cleavage planes of the semiconductor wafer. One reason is that these mirror facets are very fragile and very often become damaged by crushing between adjacent laser elements before the latter becomes separated by stretching the lower foil. Further known devices are also extremely costly in that the cross-table must be moved while the wafer is observed under a microscope in order to precisely position the wedge and anvil at each scribed line in succession. The wedge must be precisely operated.

OBJECT OF THE INVENTION

Accordingly, an object of the present invention is to provide a method of breaking a plate-like workpiece such as a semiconductor wafer, which method prevents facets of workpiece elements that are created when the workpiece is being broken from abutting and damaging each other.

Another object of the present invention is to provide a device for breaking a plate-like workpiece sandwiched between two flexible foils. A further object is a means to sandwich a device which is cheap to manufacture as well as simple and easy to operate and does not require any controlled drive nor any microscope permanently mounted at the device.

SUMMARY OF THE INVENTION

These objects, and others are attained according to the invention by a method of breaking a plate-like workpiece such as a semiconductor wafer comprising the steps of scribing one of the workpiece surfaces with at least one scribing line to define a plane where the workpiece is to be broken; placing the workpiece, with its scribed surface facing upwards, between an upper and a lower foil, both foils being elastomeric and extending beyond the margins of the workpiece, an adhesive serving to join the workpiece to the lower foil; stretching the two foils with the workpiece sandwiched in-between; applying an upward force to the lower side of the sandwich structure so as to bend the workpiece, the plane of the radius being normal to the scribed lines on the convex side of the workpiece and to break the workpiece into individual bars as determined by the scribed lines, thus enabling the part of the lower foil to which the workpiece was initially joined and to which the bars still adhere to further stretch whereby the individual bars become separated sufficiently so as to avoid mutual damage of the neighboring broken off surfaces; and removing the upper foil so that the individual bars can be further processed.

Preferably, the tensile strength of the lower foil is lower than the tensile strength of the upper foil. Also, it is preferred to stretch the sandwich in excess of the limit of elastic deformation of the lower foil and of the upper foil. The workpiece may be made of gallium arsenide, indium phosphide or silicon, or consist of an amorphous material and made of glass. In a particular embodiment of the invention, a piece of intermediate foil is interposed between the upper surface of the workpiece and the upper foil, with the piece of intermediate foil being larger than the workpiece so as to extend all around and beyond the workpiece covered therewith.

Further, according to the invention, apparatus for breaking a plate-like workpiece sandwiched between two flexible foils is disclosed and comprises: a base element having an essentially plane upper surface, its longitudinal extension being larger than that in the transverse direction; a first gripper fixedly positioned in respect of the base element, provided and arranged for releasably holding one sandwich end; a second gripper movably arranged at the base element for movement in the longitudinal direction, provided and arranged for releasably holding the other sandwich end; apparatus for adjustably displacing the second gripper in the longitudinal direction from the first gripper; and a cylindrical rod adapted to be placed on the upper surface of the base element with its cylinder axis parallel to the transverse direction and to be movable in the longitudinal direction.

Preferably, the base element is provided at its upper surface with a groove parallel to the transverse direction and adapted to receive the rod so as to completely accommodate it below the plane of the upper surface of the base element. The rod is provided with a pair of rollers symmetrically mounted thereon by respective bearings and spaced from each other by more than the width of the sandwich transverse to its lengthwise direction extending between its ends. The base element is provided at its upper surface with a pair of recessed cavities each connected to the groove and each adapted to accommodate at least a portion of a respective roller when the rod is accommodated in the groove. The base element may be provided at its upper surface with a pair of recessed tracks each connected to a respective recessed cavity, extending in the longitudinal direction and adapted to accommodate a portion of a respective roller so as to position the rod parallel to the transverse direction.

Preferably, the mentioned displacement is accomplished by two guide bars affixed to the base element parallel to the longitudinal direction, a chariot gliding on the guide bars and having a threaded bore parallel to the longitudinal direction, and a spindle adapted to be screwed into the bore and having one end abutting the base element. The remaining end of the spindle is operable to rotate the spindle. The second gripper is affixed to the chariot so as to be displaceable. The grippers may be clamps adapted to be pressed in a direction perpendicular to the upper surface of the base element, against the base element and the chariot respectively by use of a respective pair of spindles screwed into bores of the base element and the chariot. The spindles each have respective knobs adapted to abut against an upper face of the respective clamp parallel to and facing away from the upper surface of the base element, the spindles being spaced from each other by more than the width of the sandwich. Moreover, a spring may be provided to press the clamps away from the base element and the chariot, into abutment on the knobs of the spindles.

The method of the invention, preferably when implemented with the device according to the invention, provides for stretching of the lower foil after the workpiece has been adhered to it. As the lower foil has been at least partly prevented from stretching at such locations where it adheres to the workpiece, when the workpiece is broken the foil becomes capable of stretching at least in the vicinity of the newly created facets obtained as breakage planes of the workpiece. This allows the facets to become spaced from each other which efficiently prevents damage by crushing to occur between adjacent elements of the workpiece.

Also, the device according to the invention is inexpensive to manufacture as well as simple and easy to operate. It is small and light and thus is easily installed for operation or put away for storage in a cabinet. Thus, it is suitable for mass production and for use by non-skilled operators.

DESCRIPTION OF THE DRAWINGS

The invention will be described in closer detail in the following with reference to the accompanying drawings wherein.

DETAILED DESCRIPTION OF THE PREFERRED EMBODIMENT

Figure 1:
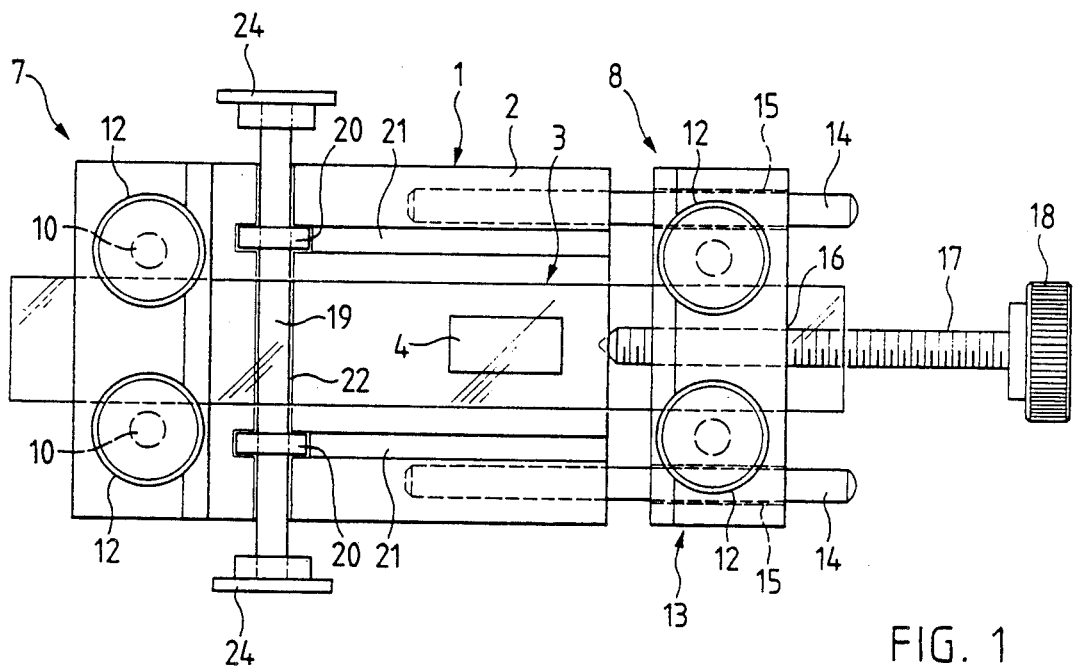
FIG. 1 is a schematic plan view of an exemplary embodiment of the device according to the invention, having a workpiece and a sandwich mounted thereon.
Figure 2:
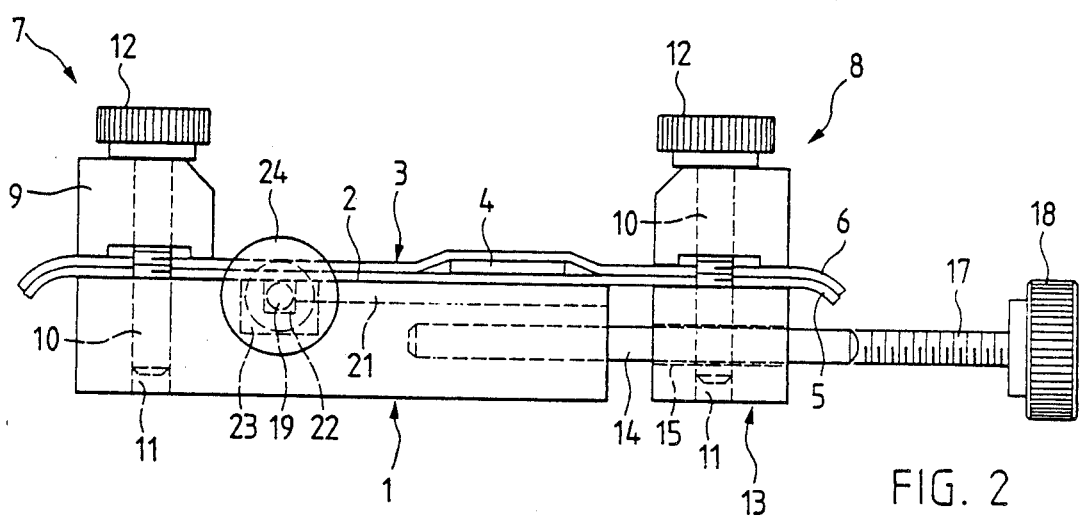
FIG. 2 is a schematic side view of the device, sandwich and breaking tool of FIG. 1.
Figure 3:
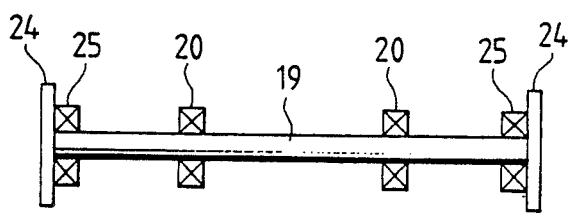
FIG. 3 is a schematic plan view of the breaking tool.

Referring now to FIGS. 1 and 2, there is shown a base element 1 adapted to receive a workpiece and foil sandwich 3. For this purpose, base element 1 has an essentially plane upper surface 2 and is constructed rectangular with greater extension in a longitudinal extension of base element 1 than in a transverse extension thereof.

Sandwich 3 is comprised of a wafer-like workpiece 4 shown just prior to being broken and which is scribed (not shown) on one of its surfaces with at least one scribing line to define a plane where it is to be broken. Workpiece 4 is delimited by plane upper and lower surfaces parallel to each other and spaced by less than half the smallest dimension of its upper or lower surface. In an exemplary embodiment, workpiece 4 is a semiconductor wafer of gallium arsenide. However, workpiece 4 can be any wafer-like piece of monocrystalline material which is to be cleaved along a desired cleavage plane, such as indium phosphide or silicon, or any plate-like piece of amorphous material such as glass.

Workpiece 4 is sandwiched with its scribed surface facing upwards between lower foil 5 and an upper foil 6. Both foils 5 and 6 extend beyond the margins of workpiece 4 so as to completely enclose the latter. In one exemplary embodiment, workpiece 4 is a gallium arsenide chip having dimensions of about $8 \times 8 \times 0.1$ mm. Sandwich 3 has dimensions of about $50 \times 10 \times 0.2$ mm to $100 \times 25 \times 0.2$ mm. In another exemplary embodiment, workpiece 4 is a glass plate having dimensions of about $18 \times 18 \times 0.16$ mm and sandwich 3 has approximately the same dimensions as above.

An adhesive which may be of the acrylic type, as known in the art, is provided on the upper face of lower foil 5 and serves to join the latter to either workpiece 4 or upper foil 6. The adhesive force is preferably as small as possible but sufficient to prevent workpiece 4 and the individual bars into which workpiece 4 is eventually broken, from falling off lower foil 5 on manipulation thereof. An adhesive force of about 100 N/m may be considered proper.

Both foils 5 and 6 are flexible and can be stretched by more than 10% without being damaged. The tensile strength of lower foil 5 is preferably lower than that of the tensile strength of upper foil 6. To this effect, the lower foil 5 may be for instance about 0.1 mm thick and made of polyvinyl chloride and the upper foil 6 may be for instance about 0.01 mm thick and made of polyester. To stretch the foils of sandwich 3, base element 1 is provided with first and second grippers 7 and 8. Grippers 7, 8 are used for releasably holding a portion of sandwich 3 near to a respective end thereof along the whole width thereof in the plane of the upper surface parallel to the transverse direction of base element 1. The second gripper may be adjustably displaced in the longitudinal direction of base element 1.

The first gripper 7 is fixedly positioned with respect to base element 1 and is constructed as a clamp 9 adapted to be pressed against base element 1 in a direction perpendicular its upper surface 2. This is accomplished by use of a pair of spindles 10 screwed into respective bores 11 of base element 1. Spindles 10 have respective knobs 12 adapted to abut against an upper face of clamp 9. Spindles 10 are spaced from each other by more than the width of sandwich 3 in order to provide passage of the latter between them. A spring (not shown) is provided to press clamp 9 away from upper surface 2 of base element 1 into abutment onto knobs 12. Thus, screwing or unscrewing knobs 12 allows the clamped portion of sandwich 3 to be held or released respectively. A second gripper 8 is constructed similar to first gripper 7 but spaced therefrom at chariot 13, an upper surface of which is in the same plane as upper surface 2 of the base element 1.

Chariot 13 is movably arranged at base element 1 for movement in its longitudinal direction and is this displaceable as previously mentioned. This displacement is accomplished by a pair of guide bars 14 affixed and parallel to the longitudinal direction of base element 1. Guide bars 14 are inserted into respective bores 15 of chariot 13 and serve as a support and guide means on which chariot 13 can be made to glide. Chariot 13 has a threaded bore 16 parallel to the longitudinal direction of base element 1 and a spindle 17 adapted to be screwed into bore 16. One end of spindle 17 abuts base element 1 and at its other end is operable to be rotated by means of a knob 18. Screwing or unscrewing spindle 17 while it is abutting base element 1 allows for the movement of chariot 13 to respectively increase or decrease the spacing between chariot 13 and base element 1. Thus, the second gripper 8 is movably arranged at base element 1 for being adjustably displaced in the longitudinal direction of base element 1.

It is apparent that when sandwich 3 is gripped between first and second gripper 7 and 8, operating knob 18 is used to increase the spacing between chariot 13 and base element 1 and will thus make sandwich 3 extend to its full length. Any further increase will stretch sandwich 3 at first in the elastic and then in the plastic deformation range of foils 5 and 6. Since the tensile strength of lower foil 5 is selected to be lower than the tensile strength of upper foil 6, stretching sandwich 3 in excess of the limit of elastic deformation of lower and upper foils 5, 6 will ensure that upper foil 6 constrains the upper side of workpiece 4 more than lower foil 5 constrains the lower side of workpiece 4. Thus, the scribed surface of workpiece 4 can be made the convex side of workpiece 4 during actual breaking.

In order to break workpiece 4, the bending tool has been designed to apply an upward force to the lower side of sandwich 3 which in turn bends workpiece 4 in such a manner that the plane of the bending radius is normal to the scribed lines on the convex side of workpiece 4. Upon bending, the workpiece breaks into individual bars as determined by the scribed lines and also by preferential cleavage planes if the workpiece material is crystalline. The bending tool contacts the lower side of workpiece 4 along a breakage line which together with the scribed line, determines the breakage plane. Thus, workpiece 4 and the bending tool should be properly oriented in respect of each other to ensure that breaking occurs along the desired plane.

In the device according to the invention, the bending tool is a cylindrical rod 19 adapted to be placed on the upper surface 2 of base element 1 with its cylinder axis parallel to the transverse direction of base element 1 and is movable in the longitudinal direction of base element 1. The diameter of this rod is about 5% of the length of the sandwich between grippers 7, 8.

To ensure and maintain its proper orientation, rod 19 is provided with a pair of rollers 20 symmetrically mounted thereon by means of respective bearings and spaced from each other by more than the width of sandwich 3 transverse to the longitudinal direction of base element 1. Upper surface 2 of base element 1 is provided with a pair of recessed tracks 21 extending in the longitudinal direction of base element 1. Tracks 21 are adapted to accommodate a portion of respective rollers 20 so that rollers 20 and tracks 21 cooperate transverse direction of base element 1.

Upper surface 2 of base element 1 is provided with a groove 22 (shown in FIGS. 4 and 5) parallel to the transverse direction of base element 1. Groove 22 is adapted to receive rod 19 (as shown in FIGS. 1 and 2) so as to completely accommodate it in a rest position thereof below the plane of upper surface 2 of base element 1. Accordingly, upper surface 2 of base element 1 is provided with a pair of recessed cavities 23 each connected to groove 22 and a respective track 21 and each adapted to accommodate at least a portion of a respective roller 20 in the rest position of rod 19.

So as to provide unhindered and easy operation of rod 19 as a breaking tool, rod 19 is made longer than the width of base element 1 and is provided with a pair of operating knobs 24 symmetrically mounted at the ends of rod 19 by use of respective bearings 25. This ensures that rod 19 is able to rotate freely as required by its eventual friction on upper surface 2 of base element 1 and on the lower side of lower foil 5.

To be stretched properly as required for breaking workpiece 4, sandwich 3 must be made to lie flat on upper surface 2 of base element 1. Accordingly, rod 19 is required to be in its rest position while sandwich 3 is stretched. Therefore, rod 19 is necessarily located below sandwich 3 when at rest between base element 1 and sandwich 3. An alternative to placing rod 19 in groove 22 is to position rod 19 on a guide bars 14 between base element 1 and chariot 13.

It is necessary for workpiece 4 to lie on base element 1 with the desired breakage planes oriented parallel to the transverse direction of base element 1. This is attained by orienting sandwich 3 with respect to rod 19 prior to clamping it in gripper 7, 8. This can be done manually by moving sandwich 3 with respect to upper surface 2 of base element 1 while observing workpiece 4 under a microscope through upper foil 6. In this regard, upper foil 6 is usually transparent or at least translucent.

In order to break workpiece 4, an operator manually lifts rod 19 with the help of knobs 24 from its rest position and out of groove 22 (or out of the space between base element 1 and chariot 13) and then moves rod 19 in the proper longitudinal direction of base element 1 (away from the groove or from the above mentioned space) so as to rest on upper surface 2 thereof. In doing this, the operator has lifted lower foil 5 from upper surface 2 of base element 1 in the vicinity of groove 22 so as to insert rod 19 between lower foil 5 and upper surface 2 of base element 1.

Figure 4:
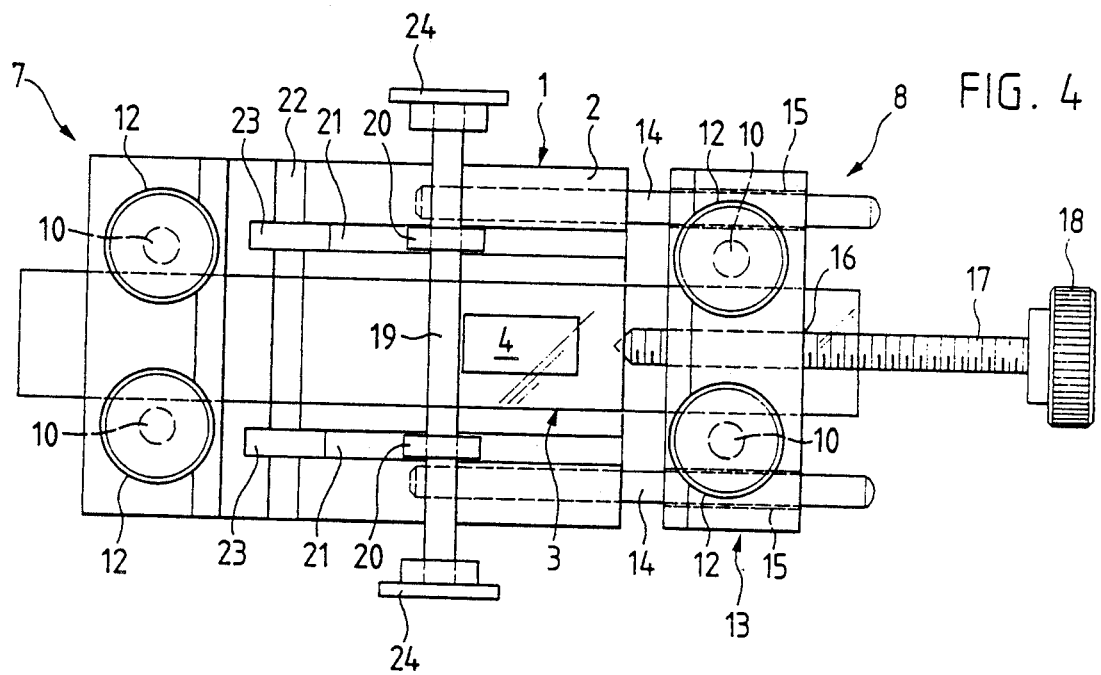
FIGS. 4 and 5 show the device according to the invention as in FIGS. 1 and 2 but with the workpiece and foil sandwich and breaking tool in a position where breaking is about to proceed.
Figure 5:
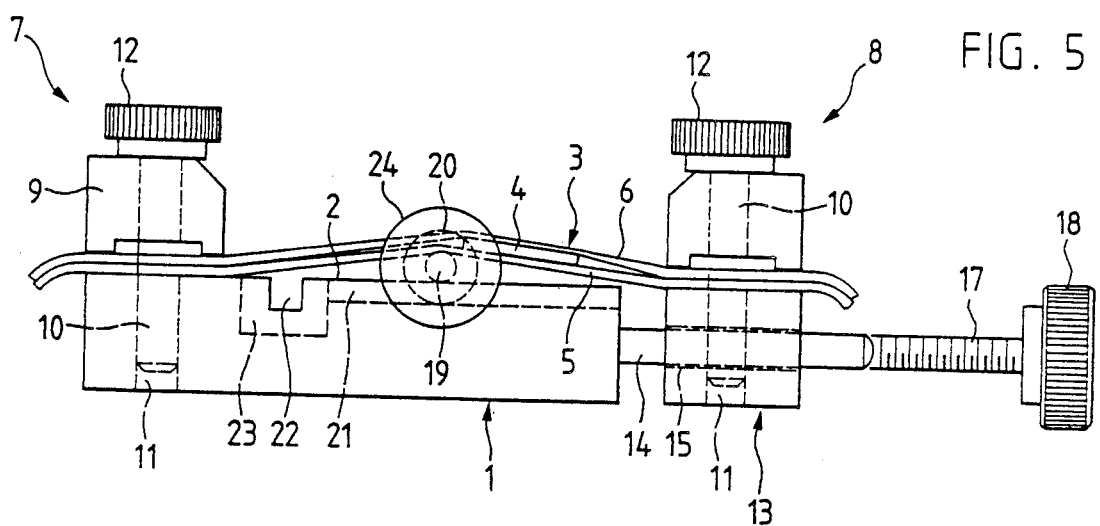

The operator then moves rod 19 further in the same longitudinal direction of base element 1 with the help of knobs 24 until rod 19 abuts workpiece 4 through lower foil 5. This stage of the breaking process is illustrated in FIGS. 4 and 5. In a variant, depending on the geometrical proportions of the device and the length of workpiece 4, the tension of foils 5 and 6 of sandwich 3 may be sufficient to move rod 19 into the described abutting position. In a futher variant, the operator moves chariot 13 by means of knob 18 to increase the tension of foils 5 and 6 to bring about this movement of rod 19 to the described abutting position.

The operator then moves rod 19 still further in the same longitudinal direction of base element 1 with the help of knobs 24 until rod 19 is positioned below workpiece 4 in sandwich 3. This movement bends workpiece 4 by forcing its lower side to become concave while its upper side becomes convex since it is still constrained by upper foil 6. This orientation prevents stress from being applied to the lower side of workpiece 4 adjoining lower foil 5 which might separate workpiece 4 from lower foil 5.

Prior to stretching sandwich 3, workpiece 4 having been sandwiched between foils 5 and 6 is made to adhere to lower foil 5. Thus, when sandwhich 3 has been stretched, workpiece 4 has prevented such stretching at least partly within that part of lower foil 5 to which it adheres. At the moment breakage occurs at some location of workpiece 4, lower foil 5 is no longer prevented from stretching in the vicinity of the break. This enables that part of lower foil 5 to which workpiece 4 was initially joined and at which workpiece breakage has occurred to further stretch. Therefore, when individual workpiece elements are created, they immediately become separated upon from the bulk workpiece. This separation is sufficient to avoid mutual damage of neighboring broken off facets since they cannot abut and/or crush each other.

After workpiece 4 has been broken at the desired locations, rod 19 is moved still further in the same longitudinal direction of base element 1 sufficiently so as to prevent any future interference between rod 19 and the workpiece elements. In order to maintain this tension, it is necessary that rod 19 does not drop from upper surface 2 into the space between base element 1 and chariot 13. A stop (not shown) mounted on base element 1 serves this purpose.

The operator then cuts upper foil 6 in the vicinity of each clamp 9, using for instance a cutter blade or small scissors. After having removed the cut off portion of upper foil 6, for instance by means of tweezers or of a suction device, the operator actuates knob 18 to further increase the spacing between chariot 13 and base element 1 so as to further stretch lower foil 5 considerably, e.g., by 50% of its initial unstretched length between clamps 9. As a result, lower foil 5 is stretched in the plastic deformation range and will not revert to its original length upon release of the stretching action. At the same time, the individual workpiece elements, for instance semiconductor laser bars, that are created when workpiece 4 is being broken, become even more separated from each other. Further, they will not revert to positions immediately adjacent to each other upon release of the stretching action. This ensures an easy removal from lower foil 5 for further processing. This removal is facilitated by the increased separation between the facets of the individual workpiece elements. This greatly minimizes the risk of these facets being damaged while the elements are taken from lower foil 5.

Figure 6:
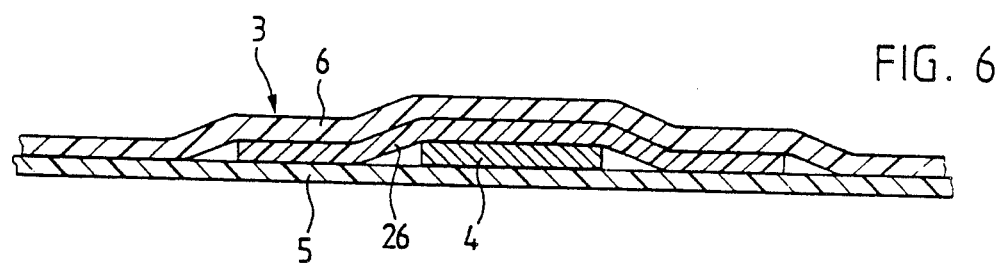
FIG. 6 is a schematic longitudinal section of a central portion of a particular embodiment of the workpiece and foil sandwich.

Preferably, a piece of intermediate foil 26 is interposed between the upper surface of workpiece 4 and upper foil 6 when sandwich 3 is made. This piece of intermediate foil 26 is larger than workpiece 4 and placed thereon so as to extend all around and beyond workpiece 4. Sandwich 3 then consists of three layers of foil as shown in FIG. 6, namely (from bottom to top) of lower foil 5, intermediate foil 26 and upper foil 6, while workpiece 4 is inserted between lower foil 5 and intermediate foil 26 in a portion of sandwich 3. The purpose of intermediate foil 26 is to reduce friction between the upper surface of workpiece 4 and upper foil 6. This improves the gliding ability of the upper surface of workpiece 4 with respect to the foil which is constraining workpiece 4, without having to reduce the strain applied to workpiece 4. This results in reduced stress and ensuing damage at edges and corners of workpiece 4. The intermediate foil may be made of polyester or polyimide of for instance about 0.02 mm thick.

As is apparent, rod 19 which is functional in performing the breaking of workpiece 4 uses only the upper part of its cylindrical mantle surface. Thus, it is alternately possible to use a rod-shaped breaking tool described or to use any breaking tool or to use any breaking tool having at its upper portion a mantle surface whose mantle lines are parallel to the desired breaking planes. In this sense, even the straight edge of a blade is equivalent to rod 19. Breaking is then performed by displacing the breaking tool so as to bring it into tangential contact with sandwich 3 and then bending sandwich 3 along the mantle surface of the breaking tool.

Accordingly, the described method and apparatus for breaking a plate-like workpiece such as a semiconductor requires the operator to scribe an upper surface of the workpiece to define one or more planes where the workpiece is to be broken; placing the workpiece in a sandwich between an upper and a lower foil with its scribed surface facing upwards; stretching the sandwich; applying an upward force to the lower side of the sandwich structure to bend the workpiece; removing the upper foil, and taking the individual bars from the lower foil for further processing.

The embodiments of the invention described in the foregoing are to be regarded as examples only and other embodiments are possible within the scope of the appended claims.

I claim:

1. A method for breaking a plate-like workpiece such as a semiconductor wafer, comprising the steps of:
   (a) scribing one of a workpiece surfaces with at least one scribing line to define a plane where the workpiece is to be broken;
   (b) making a sandwich by placing the workpiece between an upper and a lower elastomeric foil such that an adhesive disposed on the lower foils joins the non-scribed surface of the workpiece to the lower foil, the foils extending beyond the workpiece;
   (c) stretching the two foils with the workpiece sandwiched in between, in excess of the limit of elastic deformation of the lower foil and of the upper foil; and
   (d) applying an upward force to the non-scribed side of the sandwiched structure sufficiently so as to bend the workpiece, the plane of the radius of the bend being normal to any scribed lines on the convex side of the workpiece, such that the workpiece breaks into individual bars as determined by the scribed lines on the workpiece.

2. The method of claim 1, wherein in step (b) a piece of intermediate foil is interposed between the upper surface of the workpiece and the upper foil, the intermediate foil being larger than the workpiece so as to extend beyond the workpiece covered therewith.

3. The method of claim 1 comprising the additional step of:
   (e) removing the upper foil in order to facilitate removal of the individual workpiece bars.

4. The method of claim 1 wherein the foil stretches further after the workpiece is broken into individual bars sufficiently so as to avoid mutual damage to adjacent workpiece surfaces.

5. The method of claim 1 wherein in step (c) the sandwich is longitudinally stretched approximately 10% greater than that of its original longitudinal length.

6. A device of claim 1 wherein said plate-like workpiece is made from the group consisting of gallium arsenide, indium phosphide or silicon.

7. A device according to claim 19 wherein said plate-like workpiece is comprised of an amorphous material including glass.

8. A device for breaking a plate-like workpiece formed as a sandwich between two elastomeric foils wherein the plate-like workpiece has scribed lines on one surface thereof, comprising:
   a base element having an essentially planar upper surface;
   first gripping means fixedly positioned on said base element, adapted and arranged for releasably holding a sandwich therein;
   second gripping means movably disposable and adjacent to said base for releasably holding the sandwich;
   displacement means arranged for adjustably displacing said second gripping means longitudinally with respect to said first gripping means and to stretch the sandwich; and
   movable breaking means disposable adjacent the sandwich for breaking the workpiece along the scribed lines.

9. The device of claim 8, wherein the base element is provided at its upper surface with a groove parallel to its transverse direction and adapted to receive said breaking means so as to completely accommodate it below the plane of said upper surface of said base element.

10. A device according to claim 8 wherein said breaking means is comprised of a cylindrical rod adapted to be disposable on said upper surface of said base element with its cylindrical axis parallel to the transverse direction of said base element and being movable in the longitudinal direction of said base element.

11. A device according to claim 10 wherein said cylindrical rod is provided with a pair of rollers symmetrically mounted thereon and spaced from each other by more than the width of the sandwich.

12. The device of claim 10 wherein the base element is provided at its upper surface with a groove parallel to its transverse direction and adapted to receive said rod so as to completely accommodate it below the plane of said upper surface of said base element, said rod provided with a pair of rollers symmetrically mounted thereon, said rollers spaced from each other by more than the width of the sandwich, said base element being further provided at its upper surface with a pair of recessed cavities, each said recessed cavity associated with the said groove and adapted to accommodate at least a portion of said respective roller when said rod is accommodated within said groove.

13. The device of claim 12 wherein said base element is provided at its upper surface with at least a pair of recessed tracks, each said recessed track connected to a respective cavity extending longitudinally and adapted to accommodate a portion of each said respective roller so as to position said rod parallel to said transverse direction of said base.

14. The device of claim 8 wherein said displacement means is comprised of at least two guide bars fixed parallel to the longitudinal direction of said base, a chariot gliding on said guide bars having a threaded bore parallel to the longitudinal direction of said base, and a spindle adapted to be screwed into said bore and having one end abutting said base element and the other end being operable to rotate said spindle, said second gripping means being affixed to said chariot such that said second gripping means is lineally displaceable with respect to the longitudinal direction of said base.

15. A device according to claim 14 wherein said first and said second gripping means are clamps adapted to receive the sandwich.

16. A device according to claim 15 wherein said clamps are comprised of a respective pair of threaded spindles engageable with respective bores disposed in said base element and in said chariot, said threaded spindles having knobs adapted to abut against an upper surface of said clamp parallel to and facing away from said upper surface of said base element, said spindles being spaced from each other by more than the width of the sandwich.

17. The device of said claim 16 further comprising spring means disposed between said first and said second gripping means and said base element and said chariot for urging said first and said second gripping means respectively away from said base and said chariot.

18. A device for breaking a plate-like workpiece comprising:
   a sandwich comprised of:
      a plate-like workpiece having at least one scribed line on one surface thereof, an upper elastomeric foil disposed on said scribed surface and extending beyond said plate-like workpiece, a lower elastomeric foil adhesively disposed on an opposing surface of said plate-like workpiece, said lower elastomeric foil extending beyond said plate-like workpiece;

a base element having an essentially planar upper surface;

first gripping means fixedly positioned on said base element, adapted and arranged for releasably holding one end of said sandwich;

second gripping means movably disposable with respect to said base for releasably holding remaining end of said sandwich;

displacement means arranged for displacing said second gripping means longitudinally with respect to said first gripping means and for stretching said upper and lower elastomeric foils of said sandwich; and movable breaking means disposable adjacent said sandwich for breaking said plate-like workpiece along each said at least one scribed line.

19. A device according claim 18 wherein the tensile strength of said lower elastomeric foil is lower than the tensile strength of said upper elastomeric foil.

* * * * *